United States Patent [19]

Geannopoulos et al.

[11] Patent Number: 4,638,189

[45] Date of Patent: Jan. 20, 1987

[54] FAST AND GATE WITH PROGRAMMABLE OUTPUT POLARITY

[75] Inventors: George Geannopoulos; Cyrus Tsui; Mark Fitzpatrick, all of San Jose; Andy Chan, Milpitas, all of Calif.

[73] Assignee: Monolithic Memories, Incorporated, Santa Clara, Calif.

[21] Appl. No.: 626,377

[22] Filed: Jun. 29, 1984

[51] Int. Cl.⁴ .................. H03K 19/20; H03K 19/082; H03K 19/003; G06F 11/28
[52] U.S. Cl. ........................... 307/465; 307/202.1; 307/466; 307/445; 307/458; 371/25; 340/825.84
[58] Field of Search ............. 307/202.1, 445, 465, 307/466, 471, 457–458; 364/716; 371/25; 340/825.83, 825.84

[56] References Cited

U.S. PATENT DOCUMENTS

| | | | |
|---|---|---|---|
| 4,124,899 | 11/1978 | Birkner et al. | 307/465 |
| 4,157,480 | 6/1979 | Edwards | 307/465 |
| 4,422,072 | 12/1983 | Cavlan | 307/465 X |
| 4,490,812 | 12/1984 | Guterman | 307/465 X |
| 4,499,579 | 2/1985 | Still et al. | 371/25 X |
| 4,533,841 | 8/1985 | Konishi | 364/716 X |

Primary Examiner—Larry N. Anagnos
Attorney, Agent, or Firm—Steven F. Caserza; Alan H. MacPherson; Kenneth E. Leeds

[57] ABSTRACT

The present invention combines in either a logical AND function of N logical input signals, where N is a selected positive integer greater than or equal to 1, and provides programmably, either a direct AND output signal or a NAND output signal. The invention accomplishes this using a minimum number of components in the data path, between the logical input leads and logical output leads. A minimum of components in the data path reduces the propagation delay introduced by the circuit. The invention accomplishes this by providing two AND gates connected to the same set of N logical input signals. The output signal of one AND gate is inverted by an inverter with an enable/disable input lead. The output signal of the other AND gate is inverted twice by two inverters. The second inverter has an enable/-disable input lead. Means are provided for exclusively enabling one or the other of the two inverters with an enable/disable input lead. Thus, either the once inverted signal is provided to the output lead or the twice inverted signal is provided to the output lead.

16 Claims, 5 Drawing Figures

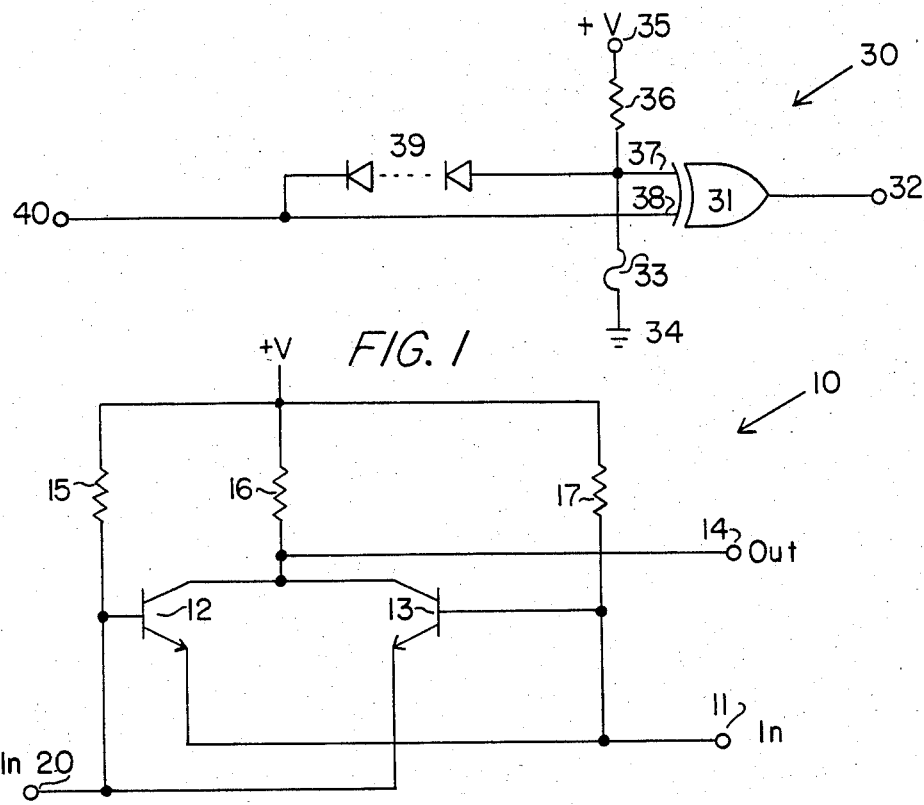
FIG. 1
FIG 2
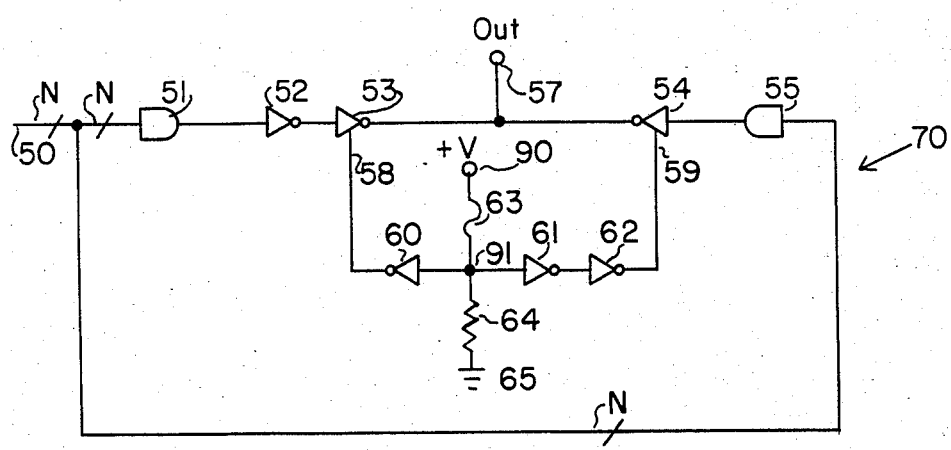
FIG. 3

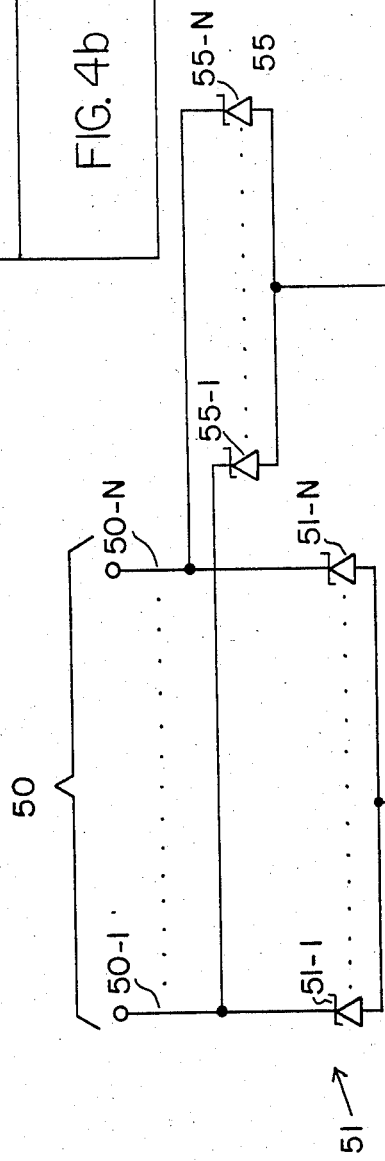
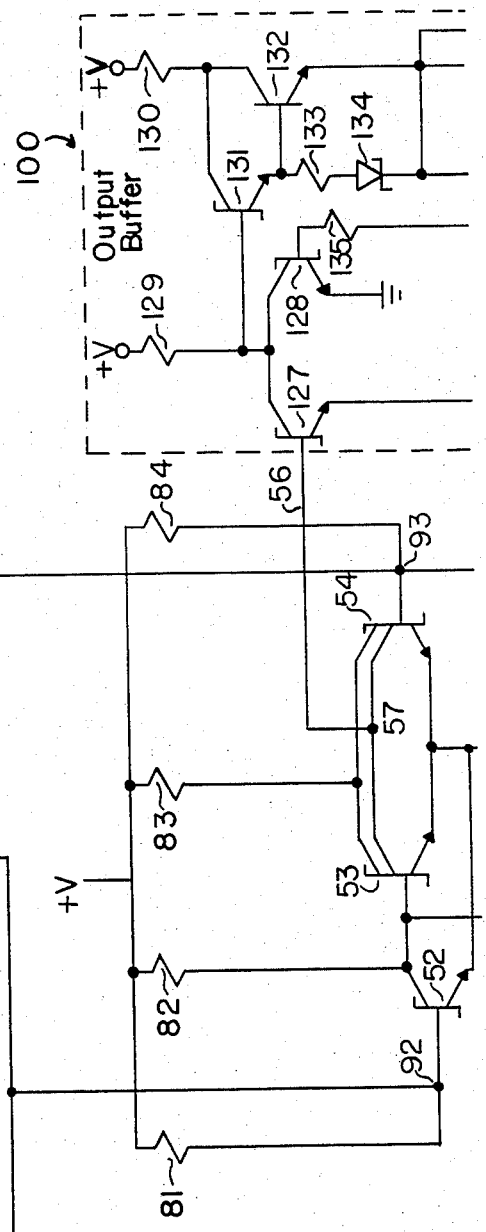
FIG. 4
FIG. 4a
FIG. 4b

FAST AND GATE WITH PROGRAMMABLE OUTPUT POLARITY

BACKGROUND OF THE INVENTION

This invention is designed to combine in either a logical AND or a logical NAND function, as desired, a large number of logical input signals. This invention has many applications and is particularly useful in the output stages of programmable array logic circuitry.

Integrated circuit manufacturers are placed in a difficult position. Each customer would like to have an integrated circuit tailored to serve the specific needs of their particular product. However, a wide range of products, that is a product tailored to each customer's demand, requires a large investment in expensive production facilities. It is therefore highly desirable to provide relatively few types of devices, each of which will serve the needs of a large number of specific applications. A partial solution to this problem is the use of programmable integrated circuits. One such programmable integrated circuit is the programmable array logic circuit disclosed by Birkner, et al. in U.S. Pat. No. 4,124,899, which is assigned to Monolithic Memories, Inc., the assignee of this application, and which is hereby incorporated by reference. A programmable array is a circuit designed to accept a large number of logical input signals and programmably combine those input signals according to the rules of boolean arithmetic in order to provide a logical output signal which is the result of those boolean arithmetic operations. The programmable array disclosed by Birkner, et al., also includes a register for holding the boolean arithmetic results and applying the results as selected input signals to the programmable array, thus allowing the programmable array logic circuit to perform dynamic (i.e., time function) boolean operations. Such circuitry is designed in order that it may be tailored to the customer's specific needs by customer programming after the manufacture of the device. Many programmable arrays are programmed by using fuses between the logical input leads and the internal gates of the device. The fuses are selectively opened so as to disconnect certain logical input leads from specific gates and to leave selected logical input leads connected to specific logical gates.

Such programmable arrays create some problems. An array usually entails combining a large number of logical input signals to create one or more logical output signals. Thus a logical gate used in a programmable array must be capable of receiving a large number of input signals. This is one problem addressed by this invention. In addition, it is desirable that logical gates in programmable array circuits be capable of producing either an output signal or the inverse of that output signal and, when several of the gates are included on a single integrated circuit, it is desirable to be able to program each one of these several gates to operate as a NAND or AND gate. A prior art example of a circuit which programmably inverts an input signal is shown in Edwards, U.S. Pat. No. 4,157,480, and is shown in FIG. 1. Edwards shows Exclusive-OR gate 31 having one input lead 37 connected to a programming means (voltage supply +V, resistor 36, and programming fuse 33) for producing a logical 1 or a logical 0, another input lead 38 connected to an input node 40 for receiving an input signal, and an output lead 32. One method of providing a programmable array circuit capable of receiving a large number of input signals and providing output signals of programmable polarity is to connect the output lead of a logical gate, such as an AND gate capable of combining a large number of logical input signals, to the input node of the programmable polarity circuit 30. However, such a circuit is dependent upon the use of Exclusive-OR gate circuitry which is relatively slow, as is the Edwards circuit itself. One prior art embodiment of a two input lead Exclusive-NOR gate 10 is shown in the schematic diagram of FIG. 2. In order to switch the Exclusive-NOR gate 10 of FIG. 2 from a logical one output signal to a logical 0 output signal, (where a logical 1 output signal is a high voltage close to the positive voltage source for the circuit and a logical 0 output signal is a low voltage close to the reference potential or ground), the input signals on input leads 11 and 20 must pull the emitter of one of transistors 12 and 13 from a logical 1 to a logical 0. To accomplish this, Exclusive-NOR gate 10 must discharge the capacitor formed by the relatively large base-emitter junction of the selected transistor. Discharging a capacitor requires a certain amount of time proportional to the size of the capacitor and the resistance of the discharge path. Thus transition from a logical 1 output signal to a logical 0 output signal is relatively slow, requiring approximately 5 nanoseconds using bipolar Schottky technology. In addition, the circuit disclosed in Edwards does not provide a method for testing the programmable inverter without destroying programming fuse 33.

SUMMARY

The present invention combines in a logical AND function N logical input signals, where N is a selected positive integer greater than or equal to 1, and provides programmably, either a direct AND output signal or a NAND output signal. The invention accomplishes this using a minimum number of components in the data path, between the input leads and output leads. A minimum of components in the data path reduces the propagation delay introduced by the circuit. The invention accomplishes this by providing two AND gates connected to the same set of N logical input signals. The output signal of one AND gate is inverted by an inverter with an enable/disable input lead. The output signal of the other AND gate is inverted twice by two inverters. The second inverter has an enable/disable input lead. Means are provided for exclusively enabling one or the other of the two inverters with an enable/disable input lead. Thus, either the once inverted signal is provided to the output lead or the twice inverted signal is provided to the output lead.

BRIEF DESCRIPTION OF THE DRAWINGS

FIG. 1 is a diagram of a prior art programmable inverter;

FIG. 2 is a schematic diagram of a prior art Exclusive-NOR gate circuit;

FIG. 3 is a logic diagram of one embodiment of the present invention; and

DETAILED DESCRIPTION

Figure 4B:
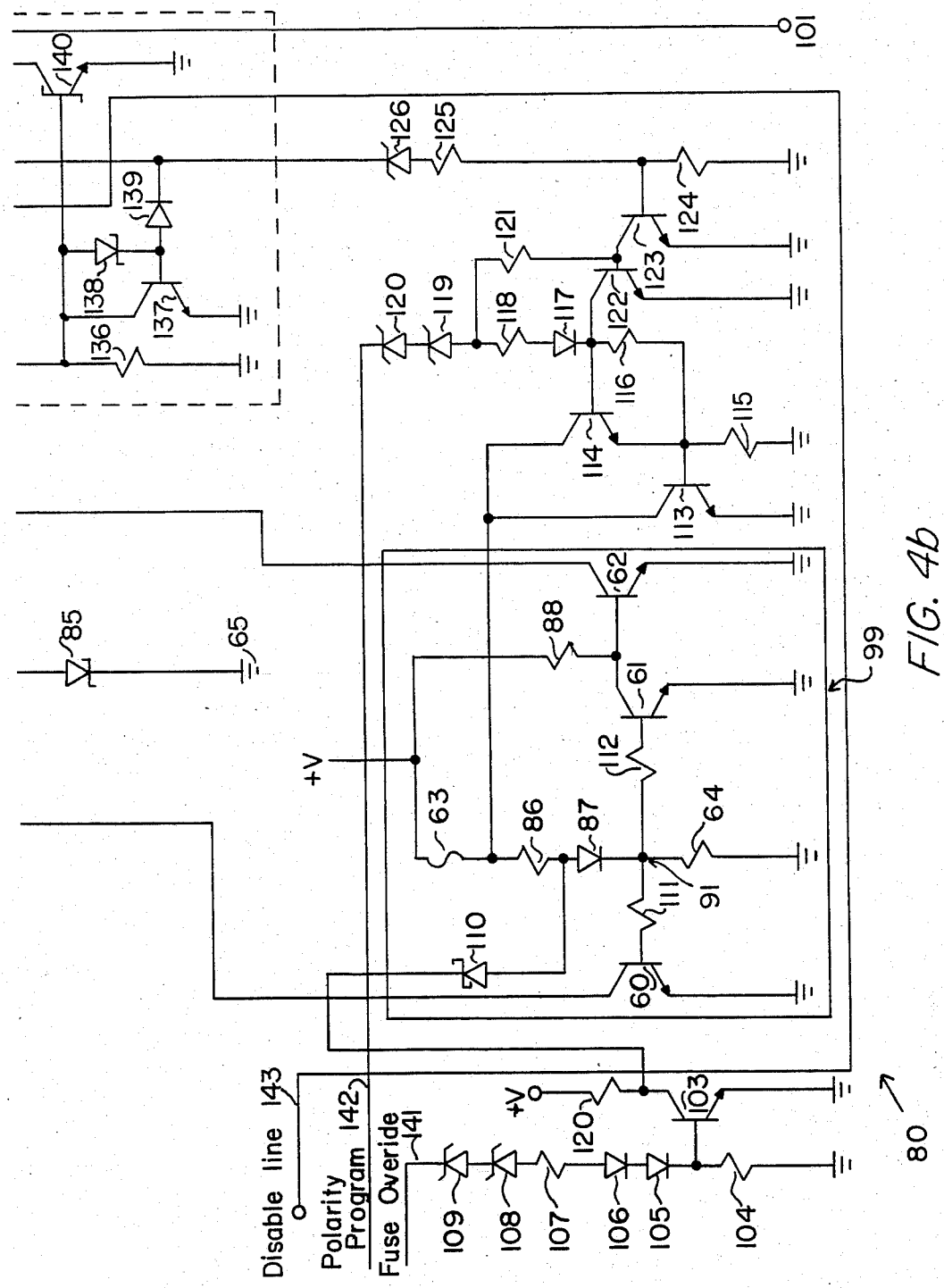
FIG. 4 is a schematic diagram of one embodiment of the present invention.

FIG. 3 is a logic diagram of one embodiment of the present invention. Input bus 50 includes any desired number N of logical input leads 50-1 through 50-N. The logical input signals received on input leads 50-1 through 50-N of bus 50 are combined in a logical AND fashion by AND gates 51 and 55. The output lead of AND gate 51 is connected to the input lead of inverter 52. Similarly, the output lead of inverter 52 is connected to the input lead of inverter 53. Inverter 53 is enabled or disabled by an enable signal provided on enable input lead 58. A logical 1 enable signal on lead 58 enables inverter 53; a logical 0 enable signal on enable input lead 58 disables inverter 53. The output lead of AND gate 55 is connected to the input lead of inverter 54. Inverter 54 is enabled in response to a logical 1 enable signal provided on enable input lead 59 and disable in response to a logical 0 enable signal on lead 59. Fuse 63 programs circuit 70 to selectively operate as an AND gate or as a NAND gate. When fuse 63 is intact, node 91 is thereby connected to positive voltage supply +V, thus node 91 is a logical 1. Conversely, when fuse 63 is opened node 91 is disconnected from the positive voltage supply +V and node 91 is pulled low (logical 0) through resistor 64 which is connected between node 91 and a reference potential or ground.

With programming fuse 63 intact, node 91 provides a logical 1 to the input lead of inverter 60, thus a logical 0 output signal is provided by inverter 60. This logical 0 output signal from inverter 60 is connected to enable input lead 58, thus disabling inverter 53. In addition, node 91 provides a logical 1 input signal to inverter 61, thus the output signal provided by inverter 61 is a logical 0. The output lead of inverter 61 is connected to the input lead of inverter 62. Thus, when the output signal of inverter 61 is a logical 0, the output signal of inverter 62 is a logical 1. The output lead of inverter 62 is connected to enable input lead 59. Thus when node 91 is a logical 1, the enable signal on enable input lead 59 is a logical 1 and inverter 54 is enabled. When inverter 54 is enabled (and, as previously described, inverter 53 is disabled), the output signal of inverter 54 is the inverse of the output signal of AND gate 55, and thus output node 57 provides an output signal which is the result of a logical NAND operation performed on the N input signals received on input leads 50-1 through 50-N of input bus 50.

Conversely, when node 91 is a logical 0 (i.e., fuse 63 is opened), inverter 53 is enabled by the logical 1 enable signal provided on the output lead of inverter 60 and inverter 54 is disabled by the logical 0 enable signal provided on the output lead of inverter 62. With inverter 53 enabled and inverter 54 disabled, the output signal of inverter 53 is connected to output node 57. The output signal of AND gate 51 is thus inverted once by inverter 52, then once again by inverter 53, therefore the output signal on output node 57 is the result of a logical AND operation performed on the N input signals received on input leads 50-1 through 50-N of input bus 50.

In summary, when fuse 63 is intact, the output signal on output node 57 is the result of a logical NAND operation on the N input signals applied to input bus 50; when fuse 63 is open, the output signal on output node 57 is the result of a logical AND operation of the N input signals applied to input bus 50.

A more detailed schematic diagram of one embodiment of the present invention is shown in the schematic diagram of FIG. 4. Input bus 50 includes input leads 50-1 through 50-N for receiving a plurality of N binary input signals. AND gates 51 and 55 include Schottky input diodes 51-1 through 51-N and 55-1 through 55-N, connected to input leads 50-1 through 50-N, respectively. When the input signal received on input lead 50-n, where $1 \leq n \leq N$, is logical 0, then diodes 51-n and 55-n are forward biased by positive voltage supply +V, which is connected to the anodes of input diodes 51-1 through 51-N and 55-1 through 55-N through resistors 81 and 84, respectively. In order to forward bias transistors 52 or 54, nodes 92 or 93, respectively, must have a voltage greater than or equal to $V_{be}$ plus $V_d$, where $V_{be}$ is equal to the forward biased base to emitter voltage of transistors 52 and 54 and $V_d$ is equal to the forward biased voltage of diode 85. Because a logical 0 input signal is nearly equal to ground, when a logical 0 input signal is received on input lead 50-n the voltage at nodes 92 and 93 is approximately equal to $V_d$; thus nodes 92 and 93 have a potential less than $V_{be}+V_d$) and transistors 52 and 54 are turned off. If all of lines 50-1 through 50-N receive logical 1 input signals, all of diodes 51-1 through 51-N and 55-1 through 55-N are reverse biased because the voltage difference between the reference potential and a logical 1 potential is very small and less than the voltage required to forward bias diodes 51-1 through 51-N or 55-1 through 55-N. Assuming for the moment that transistors 60 and 62 are off, then the voltage levels at nodes 92 and 93 is above the voltage level needed to forward bias transistors 52 and 54, and transistors 52 and 54 turn on. In summary, diode banks 51 and 55 function as AND gates turning on transistors 52 and 54, respectively, when all of the input signals on input bus 50 are a logical 1.

When transistor 52 is turned on, the base of transistor 53 is pulled low through transistor 52, thereby turning transistor 53 off. When the base of transistor 53 is low, transistor 53 does not conduct and there is a high impedance between output node 57 and ground. For purposes of this particular embodiment, a high impedance between output node 57 and ground is a logical 1 input signal to output buffer 100; a low impedance between output node 57 and ground is a logical 0 input signal to output buffer 100.

When all input signals received on input bus 50 are logical 1, transistor 54 is turned on as previously described. When transistor 54 conducts, output node 57 has a low impedance to ground, and thus the output signal on output node 57 is a logical 0.

The assumption that transistors 60 and 62 do not conduct creates an inconsistency in the above discussion. When one or more of the N input signals received on input leads 50-1 through 50-N of input bus 50 is a logical 0, transistor 53 tends to cause output node 57 to have a low impedance to ground and transistor 54 tends to cause output node 57 to have a low impedance to ground, as previously described. Conversely, when all the N input signals received on input leads 50-1 through 50-N of input bus 50 are logical 1, transistor 53 tends to cause output node 57 to have a high impedance to ground and transistor 54 tends to cause output node 57 to have a low impedance to ground. Thus, if transistors 53 and 54 were both enabled simultaneously, the output node 57 will always have a low impedance to ground regardless of the input signals received on input leads 50-1 through 50-N. However, enable circuit 99 shown in FIG. 4 removes this inconsistency by selectively enabling either transistor 53 or transistor 54, and thus preventing transistors 53 and 54 from both being enabled simultaneously. In the embodiment of enable circuit 99 shown in FIG. 4, the selection of whether transistor 53 or transistor 54 is to be enabled is provided by fusible link 63. In alternative embodiments of this invention, enable circuit 99 may select to enable either transistor 53 or transistor 54 in response to any one of a number of criteria, including the use of programmable transistors or memory cells, programmable electrical interconnects, and receipt of a signal from external circuitry, as will be understood by those of ordinary skill in the art in light of the teachings of this invention.

Referring again to FIG. 4, the specific embodiment of enable circuit 99 shown therein operates as follows. When fusible link 63 is intact, current flows from the positive voltage supply +V through fusible link 63, resistor 86, diode 87, and resistor 64 to ground. The voltage drop across resistor 64 forward biases the base-emitter junction of transistor 60, thus turning on transistor 60. With transistor 60 turned on, a low impedance path is created through transistor 60 between the base of transistor 53 and ground. Thus, when fusible link 63 is intact, bias can never be provided to the base of transistor 53 and thus transistor 53 is disabled and does not operate in response to the input signals received on input bus 50. Furthermore, when fusible link 63 is intact, the voltage drop across resistor 64 provides bias to the base of transistor 61 thus turning on transistor 61. Transistor 61 thus provides a low impedance path from the base of transistor 62 to ground, thus turning off transistor 62. With transistor 62 turned off, transistor 62 provides a high impedance path between the base of transistor 54 (node 93) and ground. Since transistor 62 does not pull the base of transistor 54 to ground, transistor 54 is enabled and turns on and off in response to the input signals applied to input leads 50-1 through 50-N. Therefore, when fusible link 63 is intact, transistor 53 is disabled and transistor 54 is enabled, and thus circuit 80 functions as a NAND gate.

Conversely, when fusible link 63 is open, node 91 is disconnected from positive voltage supply +V and node 91 is thus pulled to ground through resistor 64. When node 91 is near ground potential, transistors 60 and 61 are turned off. With transistor 60 off, the base of transistor 53 is not connected to ground and transistor 53 is thus enabled and turns on and off in response to the input signals applied to input leads 50-1 through 50-N. When transistor 61 is turned off, the base of transistor 62 is not pulled to ground and therefore the base-emitter junction of transistor 62 is forward biased by positive voltage supply potential +V through resistor 88, and thus transistor 62 is turned on. With transistor 62 on, the base of transistor 54 is pulled to ground and thus transistor 54 is turned off and disabled. Therefore, when fusible link 63 is open, transistor 53 is enabled and transistor 54 is disabled, and thus circuit 80 functions as an AND gate.

Fusible link 63 is opened by first raising the external polarity program line 142 to approximately 18 to 20 volts. This voltage is sufficient to bias zener diodes 120 and 119 past their zener breakdown voltage. Therefore, bias is supplied to transistor 122 through zener diodes 120, 119, resistor 118 and diode 117, and thus transistor 122 is on. Therefore, transistor 122 provides a low impedance path to ground and thus transistor 114 is off. The disable input lead 143 is raised to a logical 1, thereby turning on transistor 128 in output buffer 100. Because transistor 128 is on, the base of transistor 131 is nearly at ground and transistor 127 cannot forward bias transistor 140. Therefore, transistors 131 and 140 are off and output lead 101 is isolated from the output buffer circuit 100. Output lead 101 is then raised to approximately 10 to 11 volts by applying an external voltage. This voltage is sufficient to bias zener diode 126 past its zener breakdown voltage and thus provides bias to the base of transistor 123 through resistor 125 in order to turn on transistor 123. Because transistor 123 is on, the base of transistor 122 is nearly ground, and therefore transistor 122 is off. Because transistor 122 is off, the high voltage applied to polarity program line 142 provides bias to the base of transistor 114 turning on transistor 114 which therefore provides bias to the base of transistor 113, turning on transistor 113. When on, the Darlington pair of transistors 114 and 113 conduct sufficient current from positive voltage supply +V, through fuse 63, in order to open fuse 63. In one embodiment of this invention there is one polarity program line and one disable line for the entire programmable array. Therefore, the above-mentioned steps to open fuse 63 are necessary in order that output lead 101, one of which is provided for each output buffer, is used to program fuse 63.

Fuse override input lead 141 is utilized to test whether all components in the circuit are operating properly and that fuse 63 is intact after manufacture but before programming by the end user. Fuse override input lead 141 is brought to a voltage level of approximately 18 to 20 volts. This voltage is sufficient to bias zener diodes 109 and 108 past their zener breakdown voltage. Therefore, the voltage provided on the fuse override line is sufficient to forward bias transistor 103, thereby providing base drive to transistor 103 through resistor 107 and diodes 105, 106, thus turning on transistor 103. Transistor 103 then pulls the cathode of diode 110 to a voltage level near ground. Resistor 86 limits the current drawn by transistor 103 from voltage supply +V through fuse 63 to insure that fuse 63 remains intact during this testing operation. Because the anode of diode 87 is at a potential near ground, diode 87 is not forward biased and thus node 91 is pulled to ground through resistor 64. Therefore, node 91 has precisely the same voltage as if fuse 63 were opened. Thus, both the AND gate and NAND gate of circuit 80 can be nondestructively tested.

While this specification illustrates specific embodiments of this invention, it is not to be interpreted as limiting the scope of the invention. Many embodiments of this invention will become evident to those of ordinary skill in the art in light of the teachings of this specification.

We claim:

1. A programmable polarity circuit having a first input terminal, a second input terminal, an output terminal, a first programming input terminal and a second programming input terminal comprising:

a first inverter having an output lead, and having an input lead connected to said first input terminal;

a second inverter having an input lead connected to said output lead of said first inverter, an output lead connected to said output terminal, and an enable input lead connected to said first programming input terminal wherein, when the programming input signal applied to said enable input lead of said second inverter is a first binary state said second inverter is enabled, and when the input signal applied to said enable input lead of said second inverter is a second binary state opposite said first binary state, said second inverter is disabled; and a third inverter having an input lead connected to said second input terminal, an output lead connected to said output terminal, and an enable input lead connected to said second programming input terminal wherein, when the input signal applied to said enable input lead of said third inverter is said first logical state said third inverter is enabled, and when the input signal applied to said enable input lead of said third inverter is said second logical state said third inverter is disabled.

2. A circuit as in claim 1 wherein said first and second input terminals are connected in common.

3. A circuit as in claim 1 including:
 a first logical gate having a plurality of 1 to N input leads, where N is a positive integer, and an output lead connected to said first input terminal;
 a second logical gate having a plurality of 1 to N input leads, and an output lead connected to said second input terminal; and
 a plurality of N input terminals, each said input terminal uniquely connected to one of said input leads of said first logical gate and uniquely connected to one of said input leads of said second logical gate.

4. A circuit as in claim 3 wherein said first and second logical gates are selected from a group of logical gates or any combination of this group of logical gates consisting of AND, NAND, OR, NOR and Exclusive-OR gates.

5. A circuit as in claim 3 which further comprises programming means having a first and a second output lead connected to said first and second programming input terminals capable of being programmed such that said programming means provides either a binary signal of said first logical state on said first output lead of said programming means and a binary output signal of said second logical state on said second output lead of said programming means, or a binary signal of said second logical state on said first output lead of said programming means and a binary signal of said first logical state on said second output lead of said programming means.

6. A circuit as in claim 5 in which said programming means comprises:
 a programming element having a first lead connected to a first source of potential and having a second lead, said programming element having a first state in which said first and second leads are connected and having a second state in which said first and second leads are not connected;
 a resistor having a first lead connected to said second lead of said programming element and a second lead connected to a second source of potential;
 a fourth inverter having an input lead connected to said first lead of said resistor and an output lead serving as said first output lead of said programming means; and
 a means for providing a signal on said second output lead of said programming means which is opposite to the signal on said first output lead of said programming means.

7. A circuit as in claim 6 wherein said fourth inverter comprises:
 pull up means having a first lead connected to said source of positive potential and a second lead connected to said input lead of said fourth inverter; and
 a transistor having a base connected to said second lead of said pull up means, a collector connected to said output lead, and an emitter connected to said reference potential.

8. A circuit as in claim 6 wherein said programming element comprises a device selected from the group of devices consisting of fusible links, transistors and conductive interconnects.

9. A circuit as in claim 6 which includes test means for simulating that said programming element is in said second state when in fact said programming element is in said first state comprising means for connecting said second lead of said programming element to said second source of potential while said programming element remains in said first state.

10. A circuit as in claim 6 which includes means for setting said programming element to said second state comprising means for connecting said second lead of said programming element to said second source of potential such that sufficient current flows through said programming element to cause said programming means to switch to said second state.

11. A circuit as in claim 10 wherein said means for setting said programming element to said second state operates in response to an enable programming signal and an external signal placed on said output terminal of said programmable polarity circuit.

12. A circuit as in claim 6 wherein said means for providing a signal on said second output lead of said programming means comprises:
 a fifth inverter having an input lead connected to said first lead of said resistor and having an output lead; and
 a sixth inverter having an input lead connected to said output lead of said fifth inverter and an output lead serving as said second output lead of said programming means.

13. A circuit as in claim 5 wherein said first inverter comprises:
 a transistor having a base serving as said input lead of said first inverter, a collector serving as said output lead of said first inverter, and an emitter connected to a reference potential; and
 pull up means having a first lead connected to said source of positive potential and a second lead conneced to said collector.

14. A circuit as in claim 13 wherein said second inverter comprises:
 a transistor having a base serving as said input lead of said second inverter, a collector serving as said output lead of said second inverter, and an emitter connected to said reference potential; and
 pull up means having a first lead connected to said source of positive potential and a second lead connected to said collector;
 wherein said enable lead is connected to said base of said transistor.

15. A circuit as in claim 13 wherein said third inverter comprises:
 a transistor having a base connected to said input lead of said third inverter, a collector connected to said output lead of said third inverter, and an emitter connected to said reference potential; and
 pull up means having a first lead connected to said source of positive potential and a second lead connected to said collector;
 wherein said enable lead is connected to said base of said transistor.

16. A circuit as in claim 3 wherein said first and second logical gates are AND gates, each comprising:
 a diode bank including N diodes each having a cathode uniquely serving as one of said input leads and each having an anode commonly serving as said output lead of said AND gate; and
 pull up means having a first lead connected to a source of positive potential and a second lead serving as said output lead of said AND gate.

* * * * *